(12) United States Patent
Wu

(10) Patent No.: US 6,465,837 B1
(45) Date of Patent: Oct. 15, 2002

(54) SCALED STACK-GATE NON-VOLATILE SEMICONDUCTOR MEMORY DEVICE

(75) Inventor: Ching-Yuan Wu, Hsinchu (TW)

(73) Assignee: Silicon-Based Technology Corp. (TW)

( * ) Notice: Subject to any disclaimer, the term of this patent is extended or adjusted under 35 U.S.C. 154(b) by 0 days.

(21) Appl. No.: 09/973,093

(22) Filed: Oct. 9, 2001

(51) Int. Cl.[7] ............................................. H01L 29/788
(52) U.S. Cl. ...................... 257/315; 257/314; 257/315; 257/316; 257/317; 257/318; 257/319; 257/320; 257/321; 257/322
(58) Field of Search ................................ 257/314, 315, 257/316, 317, 318, 319, 320, 321, 322, 390, 391, 335, 336, 649

(56) References Cited

U.S. PATENT DOCUMENTS

| | | | |
|---|---|---|---|
| 4,870,470 A | * 9/1989 | Bass, Jr. et al. | ............ 357/23.5 |
| 6,069,382 A | * 5/2000 | Rahim | ......................... 257/316 |
| 6,252,271 B1 | * 6/2001 | Gambino et al. | ............ 257/315 |
| 6,323,086 B2 | * 11/2001 | Hsu et al. | .................... 438/257 |
| 2001/0001212 A1 | * 5/2001 | Gambino et al. | ............ 257/315 |
| 2001/0014501 A1 | * 8/2001 | Hsu et al. | .................... 438/257 |

* cited by examiner

Primary Examiner—Nathan J. Flynn
Assistant Examiner—Fazli Erdem
(74) Attorney, Agent, or Firm—Powell Goldstein Frazer & Murphy LLP

(57) ABSTRACT

A scaled stack-gate non-volatile semiconductor memory device having atapered floating-gate structure is disclosed by the present invention, in which a stack-gate structure including a masking dielectric layer over a control-gate layer over an intergate dielectric layer over a tapered floating-gate layer on a thin tunneling-dielectric layer is formed on a semiconductor substrate having an active region isolated by field-oxides and is oxidized. A deeper double-diffused source region having a graded doping profile formed near a gate edge and a shallow drain diffusion region are formed as the first embodiment of the present invention. The deeper double-diffused source and drain regions having a graded doping profile formed near two gate edges are formed as the second embodiment of the present invention. The shallower double-diffused source and drain regions having a graded doping profile formed near two gate edges are formed as the third embodiment of the present invention.

16 Claims, 5 Drawing Sheets

SCALED STACK-GATE NON-VOLATILE SEMICONDUCTOR MEMORY DEVICE

FIELD OF THE INVENTION

The present invention relates generally to a stack-gate non-volatile semiconductor device and more particularly to scaled stack-gate non-volatile semiconductor memory devices having a tapered floating-gate structure for high-density mass storage applications.

DESCRIPTION OF RELATED ART

A non-volatile semiconductor memory device is known to store charges in an isolated gate (known as a floating gate ) by means of either Fowler-Nordheim tunneling or hot-electron injection of electrons through a thin tunneling-dielectric layer from a semiconductor substrate and to remove or erase charges stored in an isolated gate by means of Fowler-Nordheim tunneling through a thin tunneling-dielectric layer to a semiconductor substrate or a control gate. Basically, the cell size of a non-volatile semiconductor memory device must be scaled down for high-density mass storage applications and the cell structure must be developed toward low voltage, low current and high-speed operation with high endurance and high retention.

In general, based on the cell structure the non-volatile semiconductor memory devices of the prior art can be divided into two categories: a stack-gate structure and a split-gate structure. The stack-gate structure is known to be a one-transistor cell, in which the gate length of a cell can be defined by using the minimum-feature-size of technology used. However, the split-gate structure including a floating-gate and a select gate is known to be a 1.5-transistor cell. Therefore, the stack-gate structure is more suitable for high-density mass storage applications than the split-gate structure.

FIG. 1 shows a cross-sectional view of a stack-gate non-volatile semiconductor memory device of the prior art having an asymmetrical source/drain diffusion region, in which a stack-gate structure including a masking dielectric layer 105, a control-gate layer (CG) 104, an intergate dielectric layer 103, and a floating-gate layer (FG) 102 is formed vertically over a thin tunneling-oxide layer 101 by anisotropic dry etching. A deeper source diffusion region 106a is formed by implanting a moderate dose of doping impurities into a semiconductor substrate 100 using a non-critical masking photoresist step and the phosphorous ions are frequently used. The shallow source and drain diffusion regions 107a, 107b are formed by implanting a high dose of doping impurities into a semiconductor substrate 100 in a self-aligned manner and the arsenic ions are frequently used. The dielectric spacers 108a are formed over the sidewalls of the stack-gate structure for forming the self-aligned contacts over the shallow source and drain diffusion regions 107a, 107b. The particular source doping structure shown in FIG. 1 is suitable for a stack-gate non-volatile semiconductor device being operated by channel hot-electron injection (CHEI) of hot electron into the floating gate 102 for programming and by Fowler-Nordheim tunneling of stored electrons in the floating gate 102 into the double-diffused source structure for erasing. The double-diffused source structure is used not only to eliminate the band-to-band tunneling effect for a positive source voltage applied for erasing but also to offer a larger overlapping area for erasing. It is clearly visualized that the deeper source diffusion region in the double-diffused source structure becomes an obstacle as the stack-gate length is further scaled down.

FIG. 2 shows a cross-sectional view of a stack-gate non-volatile semiconductor memory device of the prior art having a symmetrical source/drain diffusion region, in which the deeper source diffusion region 106a in FIG. 1 is removed. This particular doping structure is suitable for a stack-gate non-volatile semiconductor memory device being operated by Fowler-Nordheim tunneling of electrons between the floating-gate 102 and the semiconductor substrate 100. However, as the stack-gate length and width are scaled down, the effective tunneling area for programming/erasing is drastically reduced, resulting in higher programming/erasing time.

According to the above description, the stack-gate non-volatile semiconductor memory device of the prior arts is difficult to be scaled further. It is, therefore, an objective of the present invention to offer a stack-gate structure having a tapered floating-gate structure for a scaled stack-gate non-volatile semiconductor device.

SUMMARY OF THE INVENTION

The present invention discloses scaled stack-gate non-volatile semiconductor memory devices having a tapered floating-gate structure for high-density mass storage applications. A stack-gate structure of the present invention including a masking dielectric layer over a control-gate layer over an intergate dielectric layer over a tapered floating-gate layer on a thin tunneling-dielectric layer is formed on a semiconductor substrate having an active region isolated by field oxides and is oxidized to form a first thin poly-oxide layer over the sidewalls of the control-gate layer, a second thin poly-oxide layer over the sloped sidewalls of the tapered floating-gate layer, and a thicker oxide layer formed over each side portion of the active region having a graded-oxide layer formed near two gate edges. Different source and drain doping structures are formed in a self-aligned manner in each side portion of the active region and a dielectric spacer is formed over the sidewalls of the stack-gate structure for forming a self-aligned source/drain contact for a scaled non-volatile semiconductor memory device.

The first embodiment of the present invention is a scaled stack-gate non-volatile semiconductor memory device having a tapered floating-gate structure with a deeper double diffused source region having a graded doping profile formed near a gate edge and a shallow drain diffusion region, which offers a larger overlapping area between the tapered floating-gate layer and a deeper double-diffused source region for erasing by tunneling stored electrons in the tapered floating-gate layer into the deeper double-diffused source region without inducing the band-to-band tunneling effects and offers a longer effective channel length to alleviate the punch-through effect for programming using channel hot-electron injection.

The second embodiment of the present invention is a scaled stack-gate non-volatile semiconductor memory device having a tapered floating-gate structure with a deeper double-diffused source/drain region having a graded doping profile formed near two gate edges, which offers a larger overlapping area between the tapered floating-gate layer and a deeper double-diffused source/drain region for programming and erasing by tunneling electrons between the tapered floating-gate layer and a deeper double-diffused source/drain region without inducing the band-to-band tunneling effects and with alleviating the punch-through effects.

The third embodiment of the present invention is a scaled stack-gate non-volatile semiconductor memory device having a tapered floating-gate structure with a shallower double-diffused source/drain region having a graded doping profile formed near two gate edges, which offers a larger channel area for programming and erasing by tunneling electrons between the tapered floating-gate layer and the semiconductor substrate without inducing the band-to-band tunneling effects and with alleviating the punch-through effects.

DETAILED DESCRIPTION OF THE PREFERRED EMBODIMENTS

Figure 1:
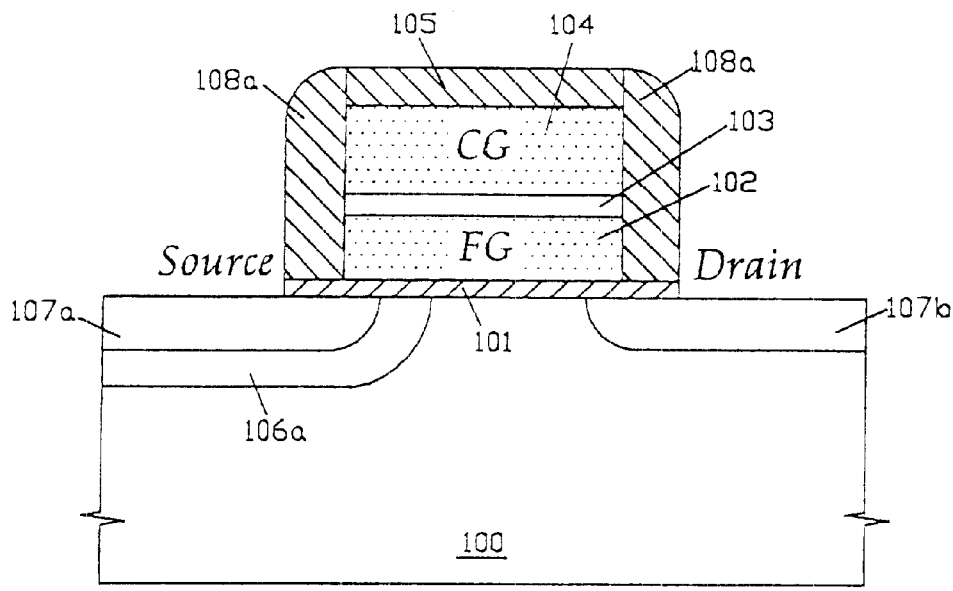
FIG. 1 shows a cross-sectional view of a stack-gate non-volatile semiconductor memory device of the prior art having an asymmetrical source/drain diffusion region.
Figure 2:
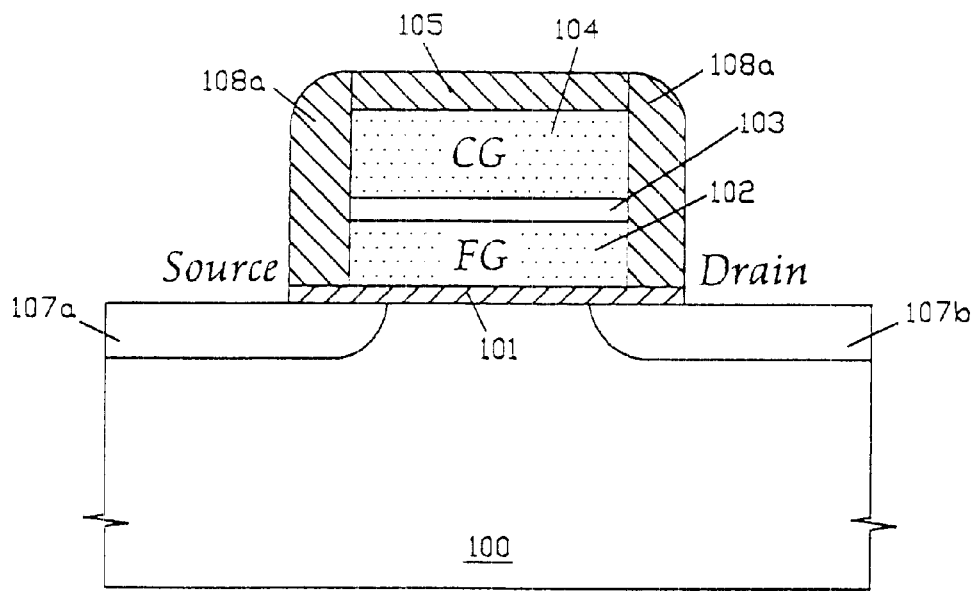
FIG. 2 shows a cross-sectional view of a stack-gate non-volatile semiconductor memory device of the prior art having a symmetrical source/drain diffusion region.
Figure 3:
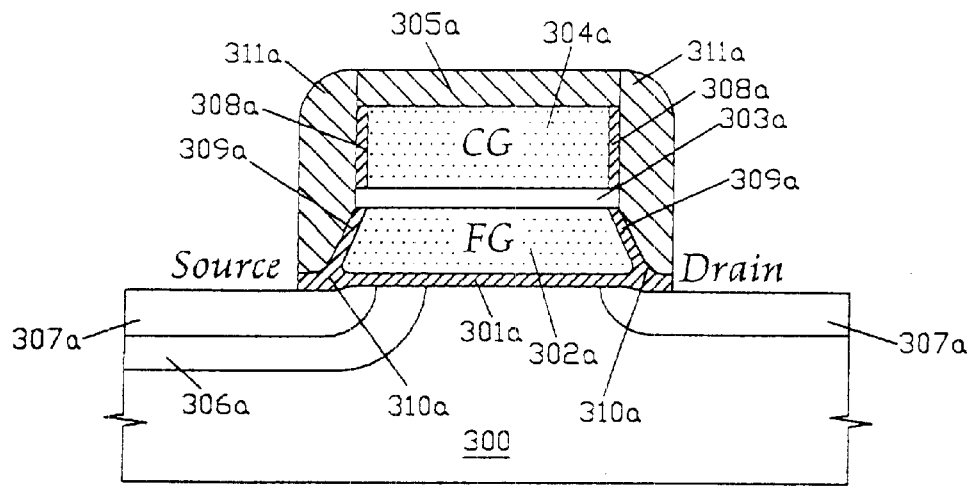
FIG. 3 shows a cross-sectional view of a scaled stack-gate non-volatile semiconductor memory device of the present invention having a tapered floating-gate structure and an asymmetrical source/drain diffusion region.

Referring now to FIG. 3 for the first embodiment of the present invention, there is shown a cross-sectional view of a scaled stack-gate non-volatile semiconductor memory device having a tapered floating-gate structure and an asymmetrical source/drain region. As shown in FIG. 3, a stack-gate structure including a masking dielectric layer 305a, a control-gate layer 304a, an intergate dielectric layer 303a, and a tapered floating-gate layer 302a is formed on a thin tunneling-dielectric layer 301a. The thin tunneling-dielectric layer 301a is formed over an active region in a semiconductor substrate 300 and the active region is isolated by field-oxides (not shown). The stack-gate structure divides the active region into two side portions with a first side portion for forming a source diffusion region and a second side portion for forming a drain diffusion region, and is oxidized to form a first thin poly-oxide layer 308a over the vertical sidewalls of a control-gate layer 304a, a second thin poly-oxide layer 309a over the sloped sidewalls of a tapered floating-gate layer 302a, and a thicker oxide layer 310a over each side portion of the active region. A deeper source diffusion region 306a having a graded doping profile near a gate edge is formed over the first side portion of the active region using a masking photoresist step and a shallow source/drain diffusion region 307a is simultaneously formed over each side portion of the active region. A dielectric spacer 311a is formed over the sidewalls of the oxidized stack-gate structure to form a self-aligned contact hole for a shallow source/drain diffusion region. The masking dielectric layer 305a is preferably a silicon-nitride layer or an oxynitride layer; the control-gate layer 304a can be a composite conductive layer having a doped polycrystalline-silicon layer capped with a tungsten-silicide layer or a high-temperature silicide layer, or a doped polycrystalline-silicon layer capped with a barrier-metal layer and then capped with a metal layer; the intergate dielectric layer 303a can be a composite dielectric layer of an oxide-nitride-oxide structure or a nitride-oxide structure or a nitrided poly-oxide layer; the tapered floating-gate layer 302a is preferably made of doped polycrystalline-silicon or doped amorphous-silicon and is formed by a taper etching with a taper angle θ between about 45 degrees and 90 degrees; the dielectric spacer 311a is preferably made of silicon-nitrides. The semiconductor substrate 300 can be a p-well or a p-type substrate, the deeper source diffusion region 306a is n-type and is preferably doped by phosphorous impurities, and the shallow source/drain diffusion region 307a is also n-type and is preferably doped by arsenic impurities. Similarly, the opposite type of semiconductor substrate can be used, but the type of doping impurities for forming the source/drain diffusion region will be p-type. It should be noted that the deeper source diffusion region 306a and the shallow source/drain diffusion region 307a are performed by implantation either before or after oxidizing the stack-gate structure, and a moderate dose of phosphorous impurities for forming the deeper source diffusion region 306a and a high dose of arsenic impurities for forming the shallow source/drain diffusion region 307a are used.

Apparently, a scaled non-volatile semiconductor memory device shown in FIG. 3 offers a larger overlapping area between the tapered floating-gate layer 302a and the deeper source diffusion region 306a having a graded doping profile formed near a gate edge for erasing stored electrons in the tapered floating-gate layer 302a to the deeper source diffusion region 306a without inducing the band-to-band tunneling effects. Moreover, the shallow drain diffusion region 307a is heavily doped to tailor the lateral electric field for hot-electron generation and also to offer a longer effective channel length for further alleviating the punch-through effect.

Figure 4:
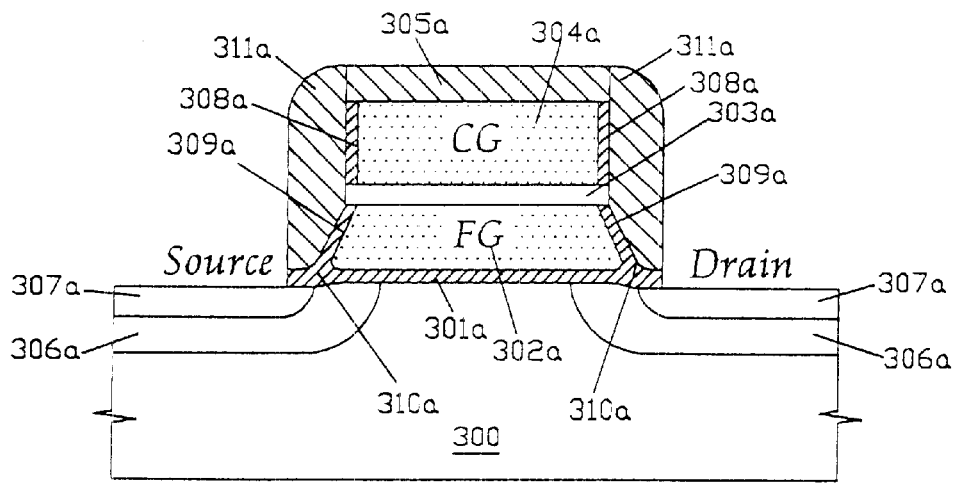
FIG. 4 Shows a cross-sectional view of a scaled stack-gate non-volatile semiconductor memory device of the present invention having a tapered floating-gate structure and a symmetrical and deeper source/drain diffusion region.

FIG.4 illustrates the second embodiment of the present invention, in which a cross-sectional view of a scaled stack-gate non-volatile semiconductor memory device having a tapered floating-gate structure and a symmetrical and deeper source/drain diffusion region is shown. Basically, the device structure over the semiconductor surface in FIG. 4 is the same as that shown in FIG. 3, however, the source and drain diffusion regions formed are different. As shown in FIG. 4, a symmetrical and deeper source/drain diffusion region 306a having a graded doping profile formed near two gate edges is formed over each side portion of the active region before or after oxidizing the stack-gate structure. Therefore, one masking photoresist step used in FIG. 3 is not required. A moderate dose of phosphorous impurities is implanted, the overlapping area between the tapered floating-gate layer 302a and the deeper source/drain diffusion region 306a would be larger. A shallow source/drain diffusion region 307a is subsequently formed in a self-aligned manner and a high-dose of arsenic impurities is used.

The scaled stack-gate non-volatile semiconductor memory device of the present invention shown in FIG. 4 can be operated by tunneling electrons from the deeper drain diffusion region 306a into the tapered floating-gate layer 302a for erasing and by tunneling stored electrons in the tapered floating-gate layer 302a into the deeper source diffusion region 306a for programming. It is clear that the punch-through effects wouldn't be easily occurred for a scaled stack-gate non-volatile semiconductor device shown in FIG. 4, because the programming/erasing operation doesn't involve the channel area. Similarly, the scaled stack-gate non-volatile semiconductor memory device can be operated by tunneling electrons from the deeper source diffusion region 306a into the tapered floating-gate layer 302a for programming and by tunneling stored electrons in the tapered floating-gate layer 302a into the deeper drain diffusion region 306a for erasing.

Figure 5:
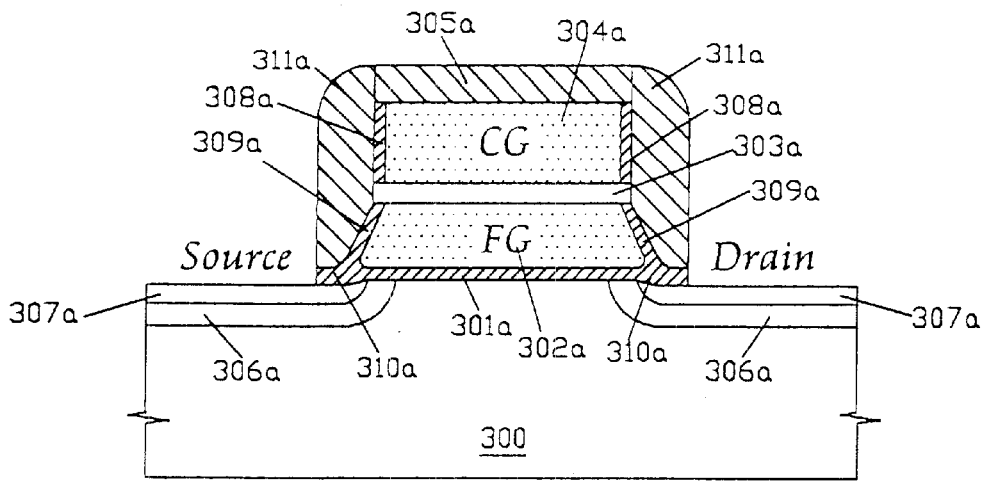
FIG. 5 shows a cross-sectional view of a scaled stack-gate non-volatile semiconductor memory device of the present invention having a tapered floating-gate structure and a symmetrical and shallower source/drain diffusion region.

FIG. 5 illustrates the third embodiment of the present invention, in which a cross-sectional view of a scaled stack-gate non-volatile semiconductor memory device having a tapered floating-gate structure and a symmetrical and shallower source/drain diffusion region is shown. The basic device structure in FIG. 5 is the same as that shown in FIG. 4 except the junction depth of the deeper source/drain diffusion region 306a. The deeper source/drain diffusion region in FIG. 5 is formed by implanting arsenic impurities instead of phosphorous impurities used in FIG. 4. Therefore, the overlapping area between the tapered floating-gate layer 302a and the deeper source/drain diffusion region becomes very small, the effective channel length becomes longer. As a consequence, the scaled stack-gate semiconductor memory device can be efficiently operated by tunneling electrons between the tapered floating-gate layer 302a and the semiconductor substrate 300 for programming and erasing through a thin tunneling-dielectric layer formed over a larger channel area.

Based on FIG. 3 through FIG. 5, it is quite apparent that a scaled stack-gate non-volatile semiconductor memory device having a tapered floating-gate structure of the present invention offers the following advantages over the prior arts:

(a) The tapered floating-gate structure of the present invention offers a scaled stack-gate non-volatile semiconductor memory device with a longer effective channel length and a graded doping profile formed near a gate edge for a deeper source diffusion region to alleviate the punch-through effect for programming using channel hot-electron injection and to offer a larger overlapping area for high-speed erasing by tunneling stored electrons in the tapered floating-gate layer into the deeper source diffusion region;

(b) The tapered floating-gate structure of the present invention offers a scaled stack-gate non-volatile semiconductor memory device with a larger overlapping area between the tapered floating-gate layer and a symmetrical and deeper source/drain diffusion region having a graded doping profile formed near two gate edges for high-speed programming/erasing by tunneling electrons between the tapered floating-gate layer and a symmetrical and deeper source/drain diffusion region; and (c) The tapered floating-gate structure of the present invention offers a scaled stack-gate non-volatile semiconductor memory device with a larger channel area for high-speed programming/erasing by tunneling electrons between the tapered floating-gate layer and the semiconductor substrate.

Referring now to FIG. 6A through FIG. 6E, there are shown the process steps and their cross-sectional views for fabricating scaled stack-gate non-volatile semiconductor memory devices having a tapered floating-gate structure and different source/drain doping structures for the present invention as shown in FIG. 3 through FIG. 5.

Figure 6A:
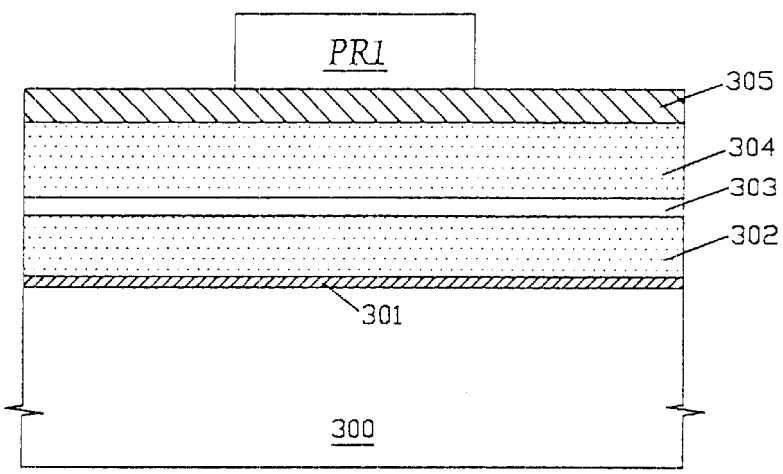
FIG. 6A through FIG. 6E show the process steps and their cross-sectional views for fabricating scaled non-volatile semiconductor devices of the present invention.

FIG. 6A shows that a multilayer structure is formed on a semiconductor substrate 300 having an active region isolated by field-oxides (not shown). The multilayer structure includes a masking dielectric layer 305, a control-gate layer 304, an intergate dielectric layer 303, and a thin tunneling-dielectric layer 301 formed over the active region. A patterned photoresist PR1 is formed over the multilayer structure to define the control-gate length of a scaled non-volatile semiconductor memory device.

Figure 6B:
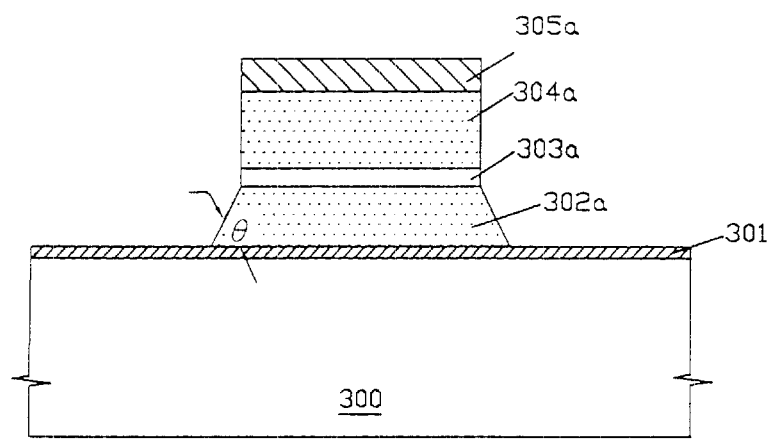

FIG. 6B shows that a stack-gate structure having a tapered floating-gate layer is formed by selectively etching the masking dielectric layer 305, the control-gate layer 304, and the intergate dielectric layer 303 and then forming a tapered floating-gate structure 302a using a taper etching. The taper angle θ is controlled between about 45 degrees and 90 degrees.

Figure 6C:
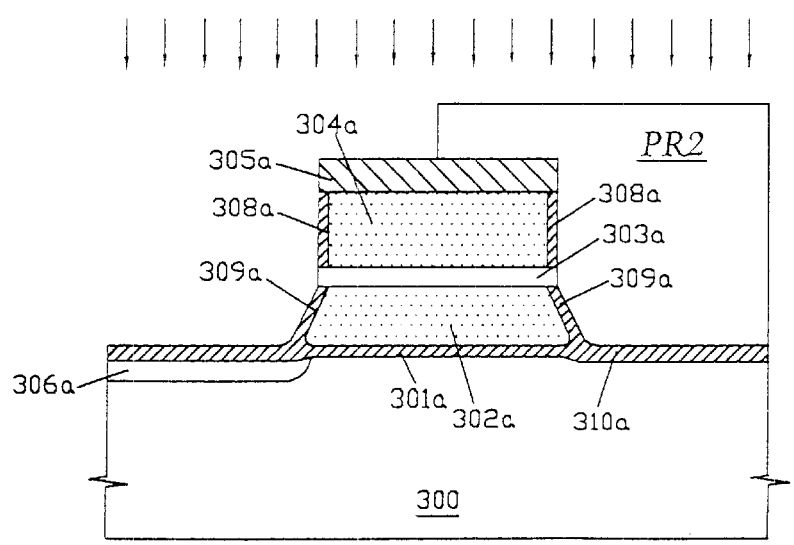
Figure 6C:
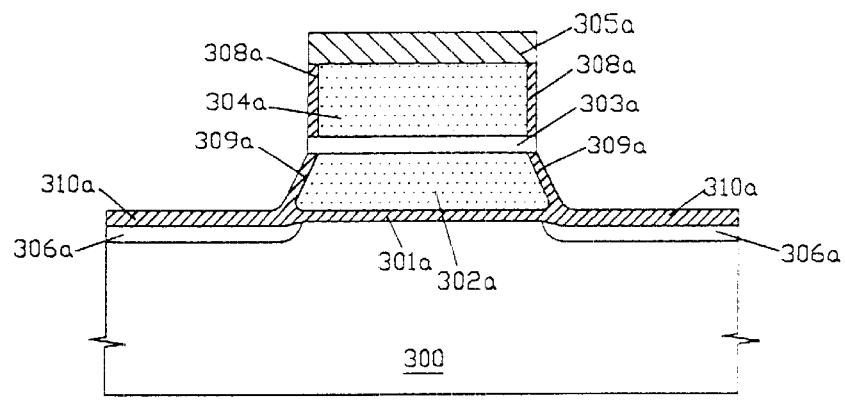

FIG. 6C shows that a stack-gate structure is first oxidized to form a first thin poly-oxide layer 308a over the sidewalls of the control-gate layer 304a, a second thin poly-oxide layer 309a over the sloped sidewalls of the tapered floating-gate layer 302a, and a thicker oxide layer 310a over each side portion of the active region having a graded-oxide layer formed near two gate edges. FIG. 6C(a) shows that a patterned masking photoresist PR2 is formed over the drain side for selectively implanting the source side to form a deeper source diffusion region 306a. Alternatively, FIG. 6C(b) shows that the deeper source/drain diffusion region 306a is formed in each side portion of the active region in a self-aligned manner without a masking photoresist step. The implanted doping impurities in FIG. 6C(a) are preferably phosphorous impurities. The implanted doping impurities in FIG. 6C(b) can be phosphorous or arsenic impurities, depending on the operation mechanism as discussed before.

Figure 6D:
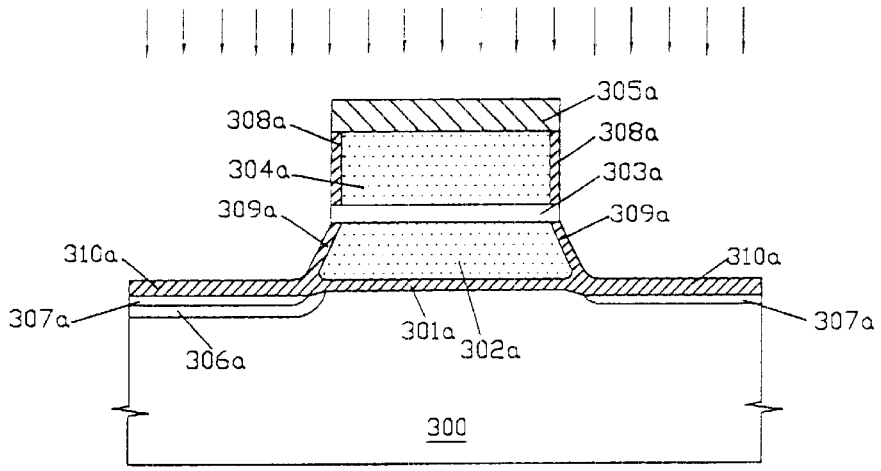
Figure 6D:
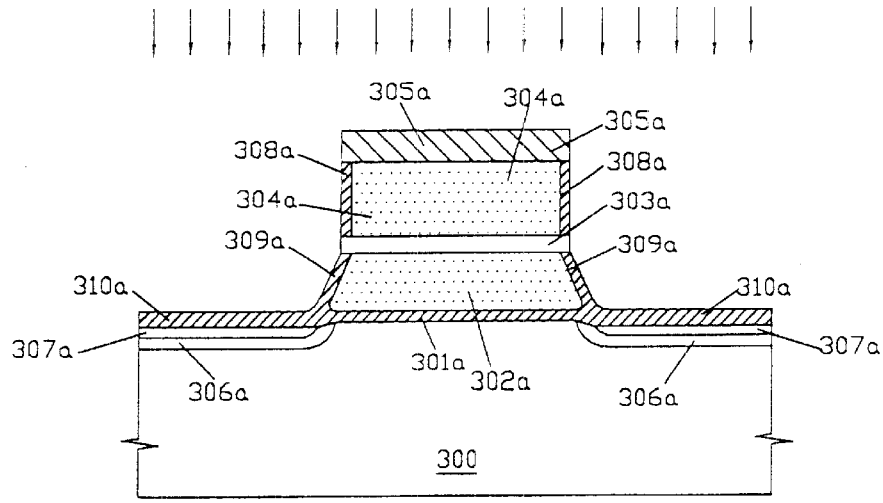

FIG. 6D(a) shows that a shallow source/drain diffusion region 307a is formed for FIG. 6C(a) with a masking photoresist PR2 being stripped and a high dose of arsenic impurities is used.

FIG. 6D(b) shows that a shallow source /drain diffusion region 307a is formed for FIG. 6C(b) and a high dose of arsenic impurities is used.

Figure 6E:
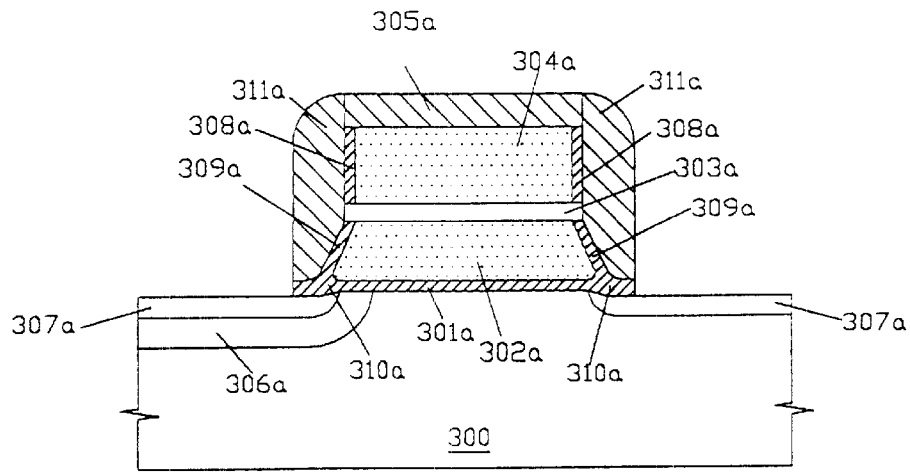
Figure 6E:
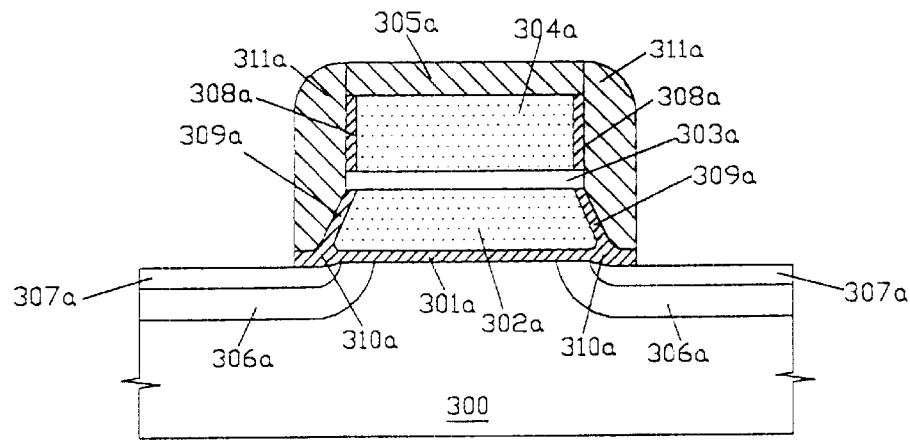
Figure 6E:
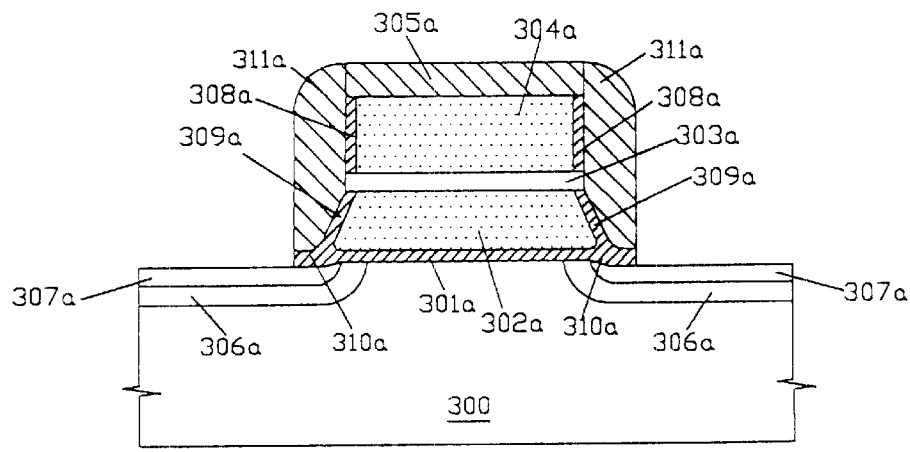

FIG. 6E(a) shows that a rapid thermal annealing is performed for a structure shown in FIG. 6D(a) to redistribute the doping impurities implanted and a dielectric spacer 311a is formed over the sidewalls of the oxidized stack-gate structure for forming a self-aligned contact hole over the shallow source/drain diffusion region 307a, as also shown in FIG. 3 for the first embodiment of the present invention.

FIG. 6E(b) shows that a rapid thermal annealing is performed for a structure shown in FIG. 6D(b) with phosphorous impurities implanted for forming a deeper source/drain diffusion region 306a and a dielectric spacer 311a is formed over the shallow source/drain diffusion region 307a, as also shown in FIG. 4 for the second embodiment of the present invention.

FIG. 6E(c) shows that a rapid thermal annealing is performed for a structure shown in FIG. 6D(b) with arsenic impurities implanted for forming a deeper source/drain diffusion region 306a and a dielectric spacer 311a is formed over the shallow source/drain diffusion region 307a, as also shown in FIG. 5 for the third embodiment of the present invention.

It should be noted that the implantation of phosphorous and arsenic impurities for forming deeper and shallow source/drain diffusion regions can be performed before oxidizing the stack-gate structure and the semiconductor substrate used is a p-well or a p-type substrate. Similarly, the semiconductor substrate can be an n-well or n-type substrate and the doping impurities used will be boron and $BF^+2$.

While the present invention has been particularly shown and described with reference to the present examples and embodiments as considered as illustrative and not restrictive. Moreover, the present invention is not to be limited to the details given herein, it will be understood by those skilled in the art that various changes in form and detail may be made without departure from the true spirit and scope of the invention.

What is claimed is:

1. A scaled stack-gate non-volatile semiconductor device comprising:

a stack-gate structure being formed on a semiconductor substrate having an active region isolated by field-oxides, said stack-gate structure includes a masking dielectric layer over a control-gate layer over an intergate dielectric layer over a tapered floating-gate layer formed on a thin tunneling-dielectric layer;

said stack-gate structure being oxidized to form a first thin poly-oxide layer over sidewalls of said control-gate layer, a second thin poly-oxide layer over sloped sidewalls of said tapered floating-gate layer, and a thicker oxide layer formed over each side portion of said active region having a graded-oxide layer formed near two gate edges;

a deeper double-diffused source region having a graded doping profile formed near a gate edge and a shallow drain diffusion region being formed in said side portion of said active region in a self-aligned manner; and a dielectric spacer being formed over sidewalls of said stack-gate structure for forming a self-aligned source/drain contact of said scaled non-volatile semiconductor memory device.

2. A scaled stack-gate non-volatile semiconductor device of claim 1 wherein said deeper double-diffused source region having a graded doping profile formed near a gate edge offers a larger overlapping area for tunneling stored electrons in said tapered floating-gate layer into said deeper double-diffused source region for erasing without inducing the band-to-band tunneling effects and said shallow drain diffusion region with respect to said deeper double-diffused source region offers a longer effective channel length for programming using channel hot-electron injection with alleviating the punch-through effects.

3. A scaled stack-gate non-volatile semiconductor device of claim 2 wherein said semiconductor substrate is a p-well or a p-type substrate, said deeper source diffusion region is formed by implanting a moderate dose of phosphorous impurities, said shallow source/drain diffusion region is formed by implanting a high-dose of arsenic impurities.

4. A scaled stack-gate non-volatile semiconductor device comprising:

a stack-gate structure being formed on a semiconductor substrate having an active region isolated by field-oxides, said stack-gate structure includes a masking dielectric layer over a control-gate layer over an intergate dielectric layer over a tapered floating-gate layer formed on a thin tunneling-dielectric layer;

said stack-gate structure being oxidized to form a first thin poly-oxide layer over sidewalls of said control-gate layer, a second thin poly-oxide layer over sloped sidewalls of said tapered floating-gate layer, and a thicker oxide layer formed over each side portion of said active region having a graded-oxide layer formed near two gate edges;

a deeper double-diffused source/drain region being formed in said side portion of said active region in a self-aligned manner having a graded doping profile formed near two gate edges; and a dielectric spacer being formed over sidewalls of said stack-gate structure for forming a self-aligned source/drain contact of said scaled non-volatile semiconductor memory device.

5. A scaled stack-gate non-volatile semiconductor device of claim 4 wherein said deeper double-diffused source/drain region having a graded doping profile formed near two gate edges offers a larger overlapping area between said tapered floating-gate layer and said deeper double-diffused source/drain region for programming and erasing by tunneling electrons through said larger overlapping area.

6. A scaled stack-gate non-volatile semiconductor device of claim 4 wherein said semiconductor substrate is a p-well or a p-type substrate, said deeper source/drain diffusion region is formed by implanting a moderate dose of phosphorous impurities, said shallow source/drain diffusion region is formed by implanting a high-dose of arsenic impurities.

7. A scaled stack-gate non-volatile semiconductor device comprising:

a stack-gate structure being formed on a semiconductor substrate having an active region isolated by field-oxides, said stack-gate structure includes a masking dielectric layer over a control-gate layer over an intergate dielectric layer over a tapered floating-gate layer formed on a thin tunneling-dielectric layer;

said stack-gate structure being oxidized to form a first thin poly-oxide layer over sidewalls of said control-gate layer, a second thin poly-oxide layer over sloped sidewalls of said tapered floating-gate layer, and a thicker oxide layer formed over each side portion of said active region having a graded-oxide layer formed near two gate edges;

a shallower double-diffused source/drain region being formed in said side portion of said active region in a self-aligned manner having a graded doping profile formed near two gate edges; and a dielectric spacer being formed over sidewalls of said stack-gate structure for forming a self-aligned source/drain contact of said scaled stack-gate non-volatile semiconductor memory device.

8. A scaled stack-gate non-volatile semiconductor device of claim 7 wherein said shallower double-diffused source/drain region having a graded doping profile formed near two gate edges offers a larger channel area for programming and erasing by tunneling electrons between said tapered floating-gate layer and said semiconductor substrate through said larger channel area.

9. A scaled stack-gate non-volatile semiconductor device of claim 7 wherein said semiconductor substrate is a p-well or a p-type substrate, said deeper source/drain diffusion region is formed by implanting a moderate dose of arsenic impurities, said shallow source/drain diffusion region is formed by implanting a high-dose of arsenic impurities.

10. A scaled stack-gate non-volatile semiconductor device of claim 1, claim 4 or claim 7 wherein said tapered floating-gate layer is formed by a taper etching with a tapered angle between about 45 degrees and 90 degrees.

11. A scaled stack-gate non-volatile semiconductor device of claim 1, claim 4 or claim 7 wherein said masking dielectric layer is preferably made of silicon-nitrides or oxynitrides and said dielectric spacer is preferably made of silicon-nitrides.

12. A scaled stack-gate non-volatile semiconductor device of claim 1, claim 4 or claim 7 wherein said control-gate layer is preferably a doped polycrystalline-silicon layer capped with a tungsten-silicide layer or a high-temperature metal-silicide layer.

13. A scaled stack-gate non-volatile semiconductor device of claim 1, claim 4 or claim 7 wherein said control-gate layer is preferably a doped polycrystalline-silicon layer capped with a barrier-metal layer and then capped with a metal layer.

14. A scaled stack-gate non-volatile semiconductor device of claim 1, claim 4 or claim 7 wherein said intergate dielectric layer is preferably a composite dielectric layer of an oxide-nitride-oxide layer or a nitride-oxide layer or a nitrided poly-oxide layer.

15. A scaled stack-gate non-volatile semiconductor device of claim 1, claim 4 or claim 7 wherein said tapered floating-gate layer is preferably a doped polycrystalline-silicon layer or a doped amorphous-silicon layer.

16. A scaled stack-gate non-volatile semiconductor device of claim 1, claim 4 or claim 7 wherein said thin tunneling-dielectric layer is preferably a thermal-oxide layer or a nitrided thermal-oxide layer.

* * * * *